United States Patent [19]

Iwamoto

[11] 4,225,975
[45] Sep. 30, 1980

[54] NOISE SUPPRESSION CIRCUIT FOR USE WITH FM RECEIVER

[75] Inventor: Yasuo Iwamoto, Nagaokakyo, Japan

[73] Assignee: Mitsubishi Denki Kabushiki Kaisha, Tokyo, Japan

[21] Appl. No.: 831,676

[22] Filed: Sep. 8, 1977

[30] Foreign Application Priority Data

Sep. 14, 1976 [JP] Japan .................................. 51/110566

[51] Int. Cl.$^2$ .......................... H03D 3/08; H04B 1/10
[52] U.S. Cl. .................................. 455/212; 455/214; 455/228; 329/130; 329/140
[58] Field of Search ............... 325/348, 349, 350, 347, 325/351, 402, 408, 473, 478; 329/129, 130, 110, 137, 135, 138, 140–143, 203, 204, 206, 178, 179; 179/1 P

[56] References Cited

U.S. PATENT DOCUMENTS

| | | | |
|---|---|---|---|
| 3,217,257 | 11/1965 | Boatwright | 325/349 |
| 3,265,976 | 8/1966 | Broadhead, Jr. | 329/137 |
| 3,525,943 | 8/1970 | Rinderle | 329/130 |
| 3,564,435 | 2/1971 | Burgert | 325/349 |
| 3,609,554 | 9/1971 | Stoker | 325/348 |
| 3,621,409 | 11/1971 | Segawa | 325/459 |
| 3,622,897 | 11/1971 | Tsugita | 329/129 |
| 3,902,018 | 8/1975 | Fockens | 179/15 BT |

OTHER PUBLICATIONS

IF and Detector Design for FM, TV & Radio Engineering, Aug.–Sep., 1953, pp. 18–22.

*Primary Examiner*—Benedict V. Safourek
*Assistant Examiner*—Tommy P. Chin
*Attorney, Agent, or Firm*—Wenderoth, Lind & Ponack

[57] ABSTRACT

Two semiconductor diodes are serially interconnected across a ratio detector in the same polarity. When the detected output from the ratio detector reaches a predetermined magnitude, both diodes are conducting and the detected output is taken from the junction of the diodes. When the detected output from the ratio detector falls due to a lower received signal level, an increase in noise level is ordinarily experienced. Because the output of the ratio detector is lower, the diodes are no longer fully conductive. This causes an increase in output impedance and a corresponding reduction in noise output.

6 Claims, 3 Drawing Figures

NOISE SUPPRESSION CIRCUIT FOR USE WITH FM RECEIVER

BACKGROUND OF THE INVENTION

This invention relates to improvements in a noise suppression circuit or a muting circuit used in an FM receiver of the type utilizing a ratio detector as a frequency discriminator.

In FM receivers, it is generally well known that noise is extremely low when the received radio wave has a sufficiently high intensity but in the absence of a received radio wave or when it is very weak, the resulting audio sound is distorted. Noise is also increased in the region in which the amplitude limiter or the ratio detector disposed in the FM receiver does not fully perform the amplitude limiting function. Therefore it is desirable to provide FM receivers with a noise suppression circuit for automatically suppressing noise under the abovementioned circumstances.

To this end, there have already been proposed a variety of so-called squelch circuits. Simple squelch circuits can be divided into two types, a mechanical type and an electronic type. In the mechanical type of squelch circuit, the intensity of the particular received radio wave is detected and a relay is operated in response to the detected intensity of the radio wave. Then, if necessary, the associated audio frequency output circuit is short circuited to prevent the application of noise to the loudspeaker or the like used for auido output. In the electronic type of squelch circuit, the noise component is taken from the frequency discriminator circuit only and amplified to provide corresponding a DC component. This DC component is applied to a squelch control circuit to change the bias applied to an associated audio frequency amplifier circuit to suppress the operation thereof.

These two types of squelch circuits can be complicated in circuit configuration and therefore expensive. Thus it has been difficult to use them with other than the high grade FM receivers. Further such squelch circuits have problems in that uncomfortable clicks are apt to be generated because their operation is too sensitive and the audio is interrupted suddenly.

Accordingly it is an object of the present invention to provide a new and improved noise suppression circuit for use having an FM receiver for suppressing noise with a simple, inexpensive circuit configuration and preventing uncomfortable clicks from being generated during the suppression of noise even when employed where the electric field intensity violently changes such as on FM receivers installed in motor vehicles.

SUMMARY OF THE INVENTION

The present invention provides a noise suppression circuit for use with an FM receiver comprising a ratio detector, a series combination formed of a plurality of semiconductor rectifier elements serially interconnected with the same polarity and including a central junction, each of the semiconductor rectifier elements having nonlinear forward characteristics, the series combination being connected in the forward direction to the ratio detector to form a DC load circuit for the latter, and means for taking an audio signal from the central junction of the series combination when said semiconductor rectifier elements become conductive in response to the detected DC output from the ratio detector reaching a predetermined level.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
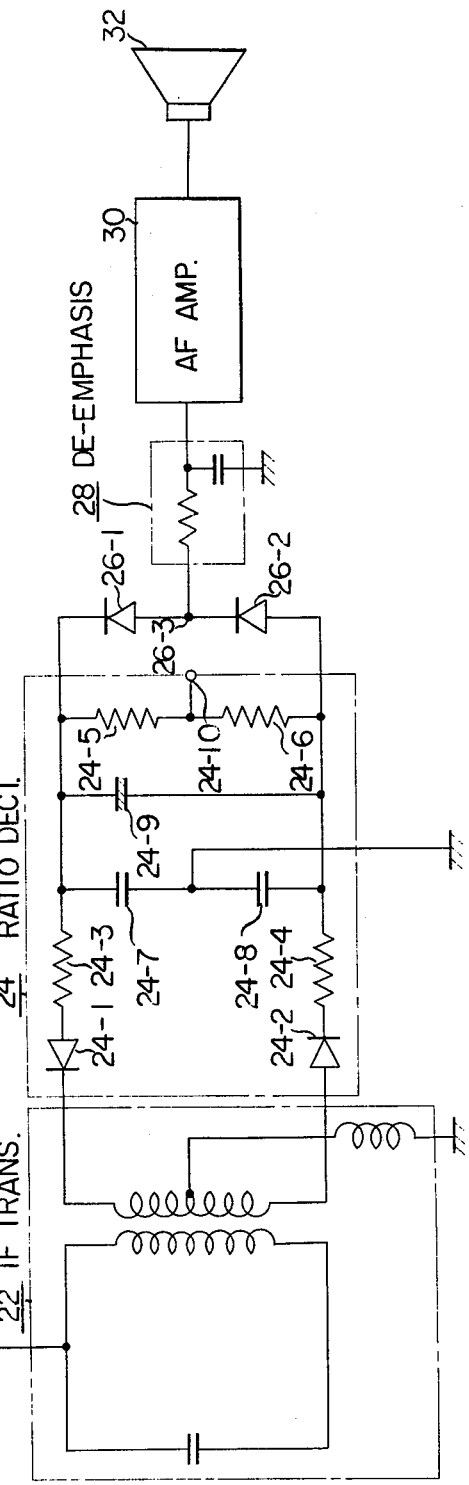
FIG. 1 is a schematic diagram of an FM receiver including a noise suppression circuit constructed in accordance with the principles of the present invention.
Figure 1:
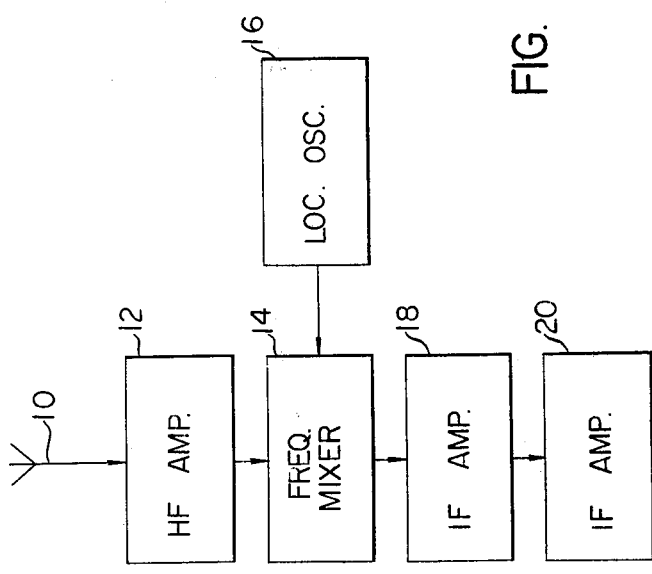

Referring now to FIG. 1 of the drawings, there is illustrated an FM receiver including a noise suppression circuit constructed in accordance with the principles of the present invention. The arrangement illustrated comprises an antenna 10, a high frequency amplifier 12 connected to the antenna 10, and a frequency mixer 14 connected to both the high frequency amplifier 12 and a local oscillator 16. The frequency mixer 14 is connected to a series combination of first and second intermediate frequency amplifiers 18 and 20 respectively. The second intermediate frequency amplifier 20 is connected via an intermediate frequency transformer 22 to a ratio detector of well-known construction generally designated by the reference numeral 24. The transformer 22 includes a primary winding tuned to the intermediate frequency involved, and a secondary winding provided with a central tap connected to ground through an inductor.

The ratio detector 24 includes a series combination of a semiconductor detection diode 24-1, a resistor 24-3 and another resistor 24-5 and a similar series combination of a semiconductor detection diode 24-2, a resistor 24-4 and a separate resistor 24-6 with the resistors 24-5 and 24-6 serially interconnected. The diode 24-1 includes a cathode electrode connected to one end, in this case, the upper end as viewed in FIG. 1, of the secondary winding of the intermediate frequency transformer 22 while the diode 24-2 includes an anode electrode connected to the other or lower end thereof. The serially connected resistors 24-5 and 24-6 are also connected across both a pair of serially connected capacitors 24-7 and 24-8 and a capacitor 24-9. The junction of the capacitors 24-7 and 24-8 is connected to ground.

According to the principles of the present invention, a pair of semiconductor switching diodes 26-1 and 26-2 are serially interconnected across the pair of serially connected resistors 24-5 and 24-6 in the same polarity. The diode 26-1 includes a cathode electrode connected to the resistor 24-5, and diode 26-2 includes an anode electrode connected to the resistor 24-6 so that both diodes are identical in polarity to each other. The junction labelled 26-3 of the anode and cathode electrodes respectively of the diodes 26-1 and 26-2 is connected to a de-emphasis circuit 28.

The de-emphasis circuit 28 is then connected to an audio frequency amplifier 30 that is, in turn, connected to a loud speaker 32.

The arrangement of FIG. 1 is substantially identical in operation to conventional FM receivers including a ratio detector such as shown by 24 in FIG. 1, except for the ratio detector 24 and the diodes 26-1 and 26-2.

In conventional FM receivers including a ratio detector, the resistors 24-5 and 24-6 serve as a the DC load for the ratio detector 24 and the junction 24-10 thereof is connected to the de-emphasis circuit 28. That is, the output signal from the ratio detector 24 is taken from the junction 24-10.

In the present invention, however, the pair of serially connected diodes 26-1 and 26-2 are connected across the ratio detector 24 or the series combination of the resistors 24-5 and 24-6 therein to form the DC load circuit. Then the output signal from the ratio detector 24 is taken from the junction 26-3 of the diodes 26-1 and 26-2.

It is well known that, semiconductor diodes become conducting resulting in the flow of forward current therethrough only when a forward voltage not less than a predetermined magnitude is applied thereacross. Therefore the higher the forward voltage across the diodes, the higher the relative decrease in the impedance thereof.

In the arrangement of FIG. 1, the series combination of load resistors 24-5 and 24-6 has a substantially constant voltage developed thereacross as long as the antenna input is high enough to maintain the signal level in the particular carrier wave sufficiently high. This voltage causes the diodes 26-1 and 26-2 to be maintained in their substantially fully conductive state. That is, both diodes are maintained in their low impedance state. Under these circumstances, an audio frequency signal is taken from the junction 26-3 of both diodes 26-1 and 26-2 and in accordance with the frequency deviation of the particular carrier wave from its center frequency. This output of the audio frequency signal is accomplished in the same manner as that previously known with respect to the output of the audio frequency signal from the junction 24-10 of the load resistors 24-5 and 24-6.

However, if the antenna input is gradually decreased to lower the signal level in the carrier wave then the detected current is also gradually decreased until the voltage across the series combination of load resistors 24-5 and 24-6 is gradually reduced. This results in a gradual increase in impedance of the diodes 26-1 and 26-2 and an increase in the output impedance of the junction 26-3. If the voltage across the series combination of resistors 26-4 and 26-5 becomes less than the predetermined magnitude, the diodes 26-1 and 26-2 are brought into their non-conducting state.

In summary, a gradual decrease in antenna input causes a gradual reduction in output level taken from the junction 26-3 and when the diodes 26-1 and 26-2 become non-conducting, the output from the junction 26-3 is null.

Figure 2:
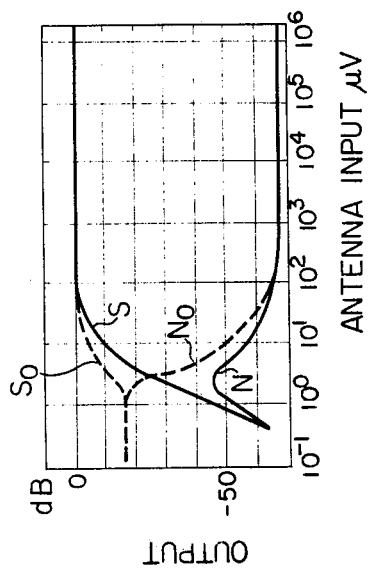
FIG. 2 is a graph plotting the signal and the noise level as the ordinate against the antenna input as the abscissa and useful in explaining the operation of the present invention.

Noise existing in the output taken from the ratio detector 24 will now be described with reference to FIG. 2 wherein the signal level S and the noise level N in a carrier wave are plotted as the ordinate against the antenna input as the abscissa. The signal and noise levels are expressed in dB on antenna input is expressed in $\mu V$ and in a logarithmic scale. From FIG. 2 it is seen that in the region in which the output from the junction 24-10 decreases with a reduction in antenna input as shown at solid curve S, the noise level in the output increases as shown at dotted curve $N_o$. Dotted curve $S_o$ depicts the output level from the junction 24-10 in the absence of a muting circuit.

In the present invention, however, when the output level is gradually decreased as shown in the solid curve S, the noise level is suppressed as shown in the solid curve N. This is because the diodes 26-1 and 26-2 are operated as above described.

From the foregoing it will readily be understood that an increase in output level at the junction 26-3 of the diodes 26-1 and 26-3 does not abruptly suppress the noise level so there is no click. Also this increase in output impedance cooperates with the de-emphasis circuit 28 and a capacitance included in a tone quality-adjusting circuit (not shown) to preferentially suppress the high frequency portion of the output. This means that, when noise generation begins the high frequency signal portion is automatically cut with the result that the intelligibility for very weak signals is better.

Figure 3:
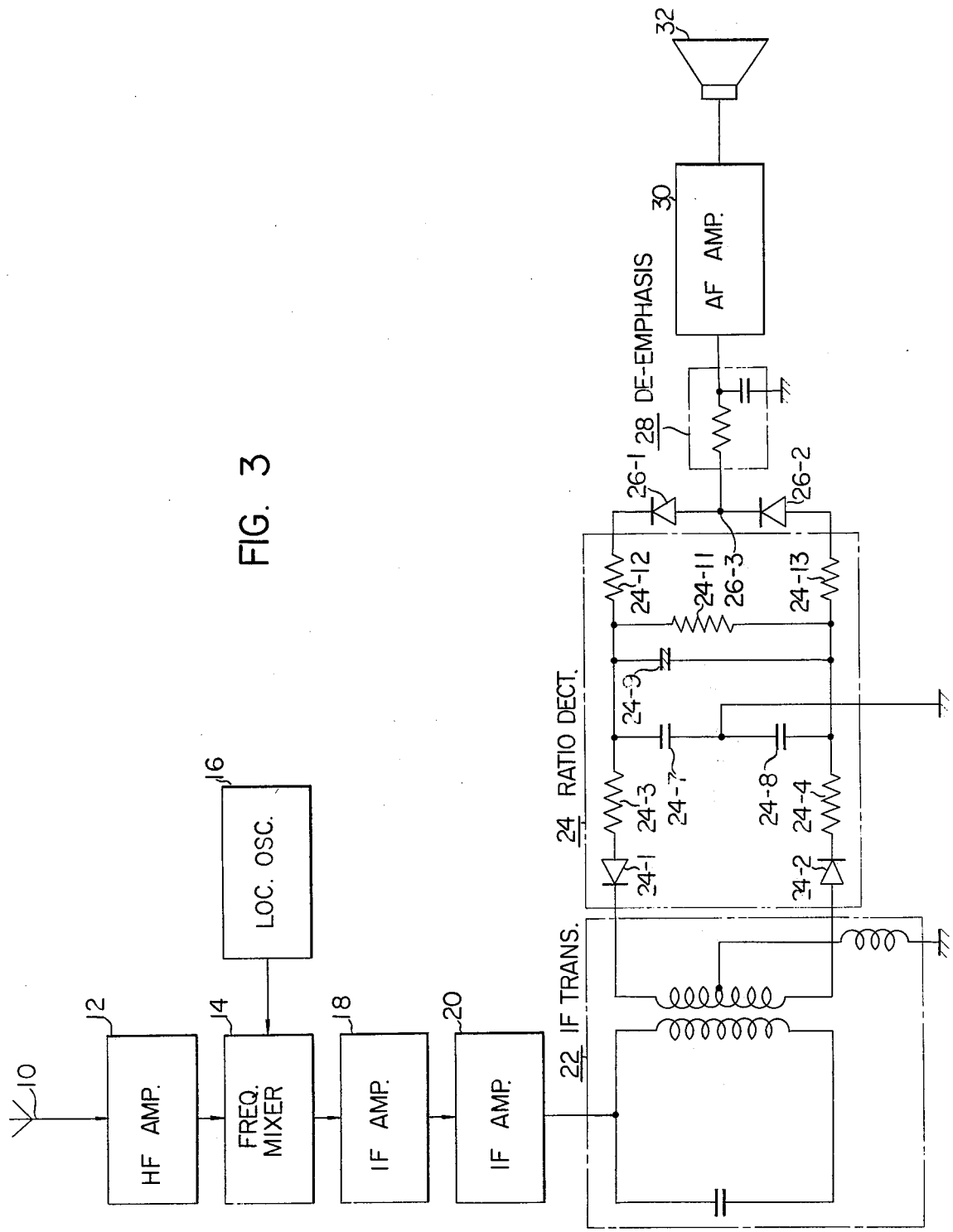
FIG. 3 is a diagram similar to FIG. 1 but illustrating a modification of the present invention.

In FIG. 3 wherein like reference numerals designate the components to or corresponding to those shown in FIG. 1, there is illustrated a modification of the present invention. The arrangement illustrated is different from that shown in FIG. 1 only in that in FIG. 3, a single resistor 24-11 is substituted for the pair of serially connected resistors 24-5 and 24-6 while a pair of compensation resistors 24-12 and 24-13 are connected between the resistor 24-11 and the diodes 26-1 and 26-2 respectively to compensate for a difference in forward resistance during the conduction between the switching diodes 26-1 and 26-2 and also to match the output impedance at the junction 26-3 to the next succeeding circuit.

The arrangement is identical in muting operation to that shown in FIG. 1.

From the foregoing it is seen that the present invention provides a noise suppression circuit for use with an FM receiver capable of suppressing noise with an extremely simple and inexpensive circuit configuration while preventing the generation of clicks upon noise suppression.

While the present invention has been illustrated and described in conjunction with a few preferred embodiments thereof it is to be understood that numerous changes and modifications may be resorted to without departing from the spirit and scope of the present invention. For example, instead of two semiconductor diodes, a plurality of pairs of semiconductor diodes such as four diodes may be serially interconnected across the output of the ratio detector in the same polarity with an audio signal taken from the central junction therof. Also the present invention is equally applicable to a wide variety of well known ratio detectors. In addition, the semiconductor diode may be replaced by any semiconductor element similar in characteristics thereto, that is to say, a nonlinear forward characteristic and a rectifying function.

What is claimed is:

1. A noise suppression circuit for use with an FM receiver comprising a ratio detector, a series combination formed of a plurality of semiconductor rectifier elements interconnected with the same polarity and having a central junction, each of said semiconductor rectifier elements having nonlinear forward characteristics, said series combination being connected to said ratio detector in a forward direction relative to the detected DC output therefrom to form a DC load circuit for the latter, and means for taking an audio signal from said central junction of said series combination, whereby said semiconductor rectifier elements become conducting when said detected DC output from said ratio detector exceeds a predetermined level thereby providing an audio signal from said central junction.

2. A noise suppression circuit for use with an FM receiver as claimed in claim 1 wherein said ratio detector includes at least a load resistance and wherein said series combination is connected across said load resistance of said ratio detector.

3. A noise suppression circuit for use with an FM receiver as claimed in claim 2 wherein said load resistance is formed of a single resistor.

4. A noise suppression circuit for use with an FM receiver as claimed in claim 1 wherein each of said semiconductor rectifier elements is a semiconductor diode.

5. A noise suppression circuit for use with an FM receiver as claimed in claim 1 wherein each of said semiconductor rectifier elements has a compensation resistor serially connected thereto.

6. A noise suppression circuit for use with an FM receiver as claimed in claim 1 wherein a de-emphasis circuit is connected to said central junction of said series combination, and said audio signal is taken through said de-emphasis circuit.

* * * * *